United States Patent
Schwantes et al.

(10) Patent No.: US 8,093,640 B2
(45) Date of Patent: Jan. 10, 2012

(54) METHOD AND SYSTEM FOR INCORPORATING HIGH VOLTAGE DEVICES IN AN EEPROM

(75) Inventors: Stefan Schwantes, Heilbronn (DE); Volker Dudek, Brackenheim (DE); Michael Graf, Leutenbach (DE); Alan Renninger, San Jose, CA (US); James Shen, Colorado Springs, CO (US)

(73) Assignee: Atmel Corporation, San Jose, CA (US)

(*) Notice: Subject to any disclaimer, the term of this patent is extended or adjusted under 35 U.S.C. 154(b) by 148 days.

(21) Appl. No.: 12/501,820

(22) Filed: Jul. 13, 2009

(65) Prior Publication Data

US 2009/0273883 A1 Nov. 5, 2009

Related U.S. Application Data

(62) Division of application No. 11/254,580, filed on Oct. 20, 2005, now Pat. No. 7,560,334.

(51) Int. Cl.
- H01L 27/108 (2006.01)
- H01L 29/76 (2006.01)
- H01L 29/94 (2006.01)
- H01L 31/119 (2006.01)

(52) U.S. Cl. . 257/303; 257/296; 257/649; 257/E21.248; 257/E21.267; 257/E21.324; 257/E21.418; 257/E21.648

(58) Field of Classification Search .......... 257/296, 257/301, 298, 303, 304, 314, 315, 316, 321, 257/649, 760, E21.248, 267, 324, 418, 648
See application file for complete search history.

(56) References Cited

U.S. PATENT DOCUMENTS

| | | | |
|---|---|---|---|
| 5,411,905 A * | 5/1995 | Acovic et al. | 438/156 |
| 5,702,988 A | 12/1997 | Liang | |
| 5,939,753 A | 8/1999 | Ma et al. | |
| 6,184,087 B1 | 2/2001 | Wu | |
| 6,288,423 B1 | 9/2001 | Sugaya | |
| 6,559,008 B2 | 5/2003 | Rabkin et al. | |
| 6,569,732 B1 * | 5/2003 | Chiang et al. | 438/238 |
| 6,638,813 B1 * | 10/2003 | Tzeng et al. | 438/244 |
| 6,835,979 B1 | 12/2004 | Liu et al. | |
| 7,560,334 B2 * | 7/2009 | Schwantes et al. | 438/253 |
| 2007/0090432 A1 | 4/2007 | Schwantes et al. | |

OTHER PUBLICATIONS

U.S. Appl. No. 11/254,580, Non-Final Offfice Action Mailed on Oct. 27, 2008, 5 Pgs.

(Continued)

*Primary Examiner* — David Nhu
(74) *Attorney, Agent, or Firm* — Fish & Richardson P.C.

(57) ABSTRACT

A method and system for fabricating a stacked capacitor and a DMOS transistor are disclosed. In one aspect, the method and system include providing a bottom plate, an insulator, and an additional layer including first and second plates. The insulator covers at least a portion of the bottom plate and resides between the first and second top plates and the bottom plate. The first and second top plates are electrically coupled through the bottom plate. In another aspect, the method and system include forming a gate oxide. The method and system also include providing SV well(s) after the gate oxide is provided. A portion of the SV well(s) resides under a field oxide region of the device. Each SV well includes first, second, and third implants having a sufficient energy to provide the portion of the SV well at a desired depth under the field oxide region without significant additional thermal processing. A gate, source, and drain are also provided.

21 Claims, 5 Drawing Sheets

OTHER PUBLICATIONS

U.S. Appl. No. 11/254,580, Non-Final Office Action mailed Jun. 2, 2008, 4 pgs.
U.S. Appl. No. 11/254,580, Response filed Jan. 27, 2009 to Non-Final Office Action mailed Oct. 27, 2008, 9 pages.
U.S. Appl. No. 11/254,580, Response filed Apr. 17, 2008 to Non-Final Office Action mailed Jan. 17, 2008, 9 pages.
U.S. Appl. No. 11/254,580, Non Final Office Action mailed Jan. 17, 2008, 9 pgs.
U.S. Appl. No. 11/254,580, Response filed Dec. 19, 2007 to Restriction Requirment mailed Jun. 4, 2007, 8 pgs.
U.S. Appl. No. 11/254,580, Response filed Sep. 2, 2008 to Non-Final Office Action mailed Jun. 2, 2008, 10 pgs.
U.S. Appl. No. 11/254,580, Restriction Requirment mailed Jun. 4, 2007, 4 pgs.
U.S. Appl. No. 11/254,580, Notice of Allowance mailed Mar. 9, 2009, 7 pgs.

* cited by examiner

METHOD AND SYSTEM FOR INCORPORATING HIGH VOLTAGE DEVICES IN AN EEPROM

RELATED APPLICATIONS

This application is a divisional of U.S. patent application Ser. No. 11/254,580 filed on Oct. 20, 2005, now U.S. Pat. No. 7,560,334, which is incorporated herein by reference in its entirety.

FIELD OF INVENTION

The present invention generally relates to semiconductor processing and more particularly to incorporating high voltage devices in low voltage CMOS processing.

BACKGROUND OF THE INVENTION

In certain applications of semiconductor technology it would be desirable to incorporate various high voltage components into semiconductor devices. In particular, semiconductor devices having both low voltage components and high voltage components in the same device may be useful. For example, it may be desirable to manufacture a semiconductor device such as an EEPROM including a high voltage capacitor and a high voltage diffuse MOS (DMOS) transistor.

Although it is desirable to have high voltage components in low voltage devices such as EEPROMs, one of ordinary skill in the art will readily recognize that there are drawbacks to doing so. In particular, processing methods for high voltage components may involve thermal treatments or other steps that adversely affect the fabrication of low voltage devices. In addition, portions of high voltage components may have requirements that may be incompatible with low voltage devices. For example, the insulator in a high voltage capacitor may be desired to have a breakdown voltage at or in excess of twenty-five or fifty volts. However, conventional low voltage devices such as EEPROMs utilize insulating layers having thicknesses that are insufficient to support such a breakdown voltage. In an EEPROM, for example, insulating layers have thicknesses that may be insufficient to provide the desired breakdown voltage for such a high voltage capacitor. Consequently, integrating high voltage components in a device utilizing processing techniques used in forming lower voltage may be problematic.

Accordingly, what is needed is a method and system for incorporating high voltage devices into processing appropriate for EEPROMs. The present invention addresses such a need.

BRIEF SUMMARY OF THE INVENTION

The present invention provides a method and system for fabricating high voltage device(s). In one aspect, the method and system provide a stacked capacitor. In this aspect, the method and system include providing a bottom plate and providing an insulator covering at least a portion of the bottom plate. In this aspect, the method and system also include providing a layer including a first top plate and a second top plate. The insulator resides between first top plate and the bottom plate and between the second top plate and the bottom plate. The first top plate is electrically coupled to the second top plate through the bottom plate. In another aspect, the method and system provide a DMOS transistor in a semiconductor device including a field oxide region. In this aspect, the method and system include providing a gate oxide. The method and system also include providing at least one SV well after the gate oxide is provided. At least a portion of the SV well(s) resides under the field oxide region. Providing the SV well(s) further includes providing a first implant, a second implant, and a third implant. Each of the implants has a sufficient energy to provide the portion of the at least one SV well at a desired depth under the field oxide region without significant additional thermal processing. The method and system also include forming a gate on the gate oxide, providing a source, and providing a drain.

According to the method and system disclosed herein, the present invention provides high voltage devices, such as capacitors and DMOS transistors, in low voltage processes.

DETAILED DESCRIPTION OF THE INVENTION

The present invention generally relates to semiconductor processing. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for fabricating high voltage device(s). In one aspect, the method and system provide a stacked capacitor. In this aspect, the method and system include providing a bottom plate and providing an insulator covering at least a portion of the bottom plate. In this aspect, the method and system also include providing a layer including a first top plate and a second top plate. The insulator resides between first top plate and the bottom plate and between the second top plate and the bottom plate. The first top plate is electrically coupled to the second top plate through the bottom plate. In another aspect, the method and system provide a DMOS transistor in a semiconductor device including a field oxide region. In this aspect, the method and system include providing a gate oxide. The method and system also include providing at least one SV well after the gate oxide is provided. At least a portion of the SV well(s) resides under the field oxide region. Providing the SV well(s) further includes providing a first implant, a second implant, and a third implant. Each of the implants has a sufficient energy to provide the portion of the at least one SV well at a desired depth under the field oxide region without significant additional thermal processing. The method and system also include forming a gate on the gate oxide, providing a source, and providing a drain.

The present invention will be described in terms of devices having particular components or particular sizes. However, one of ordinary skill in the art will readily recognize that other and/or additional components and other and/or additional sizes of components could be used. In addition, the present invention is described in the context of particular methods. One of ordinary skill in the art will readily recognize that for ease of explanation, steps may be omitted or merged in the methods described.

Figure 1:
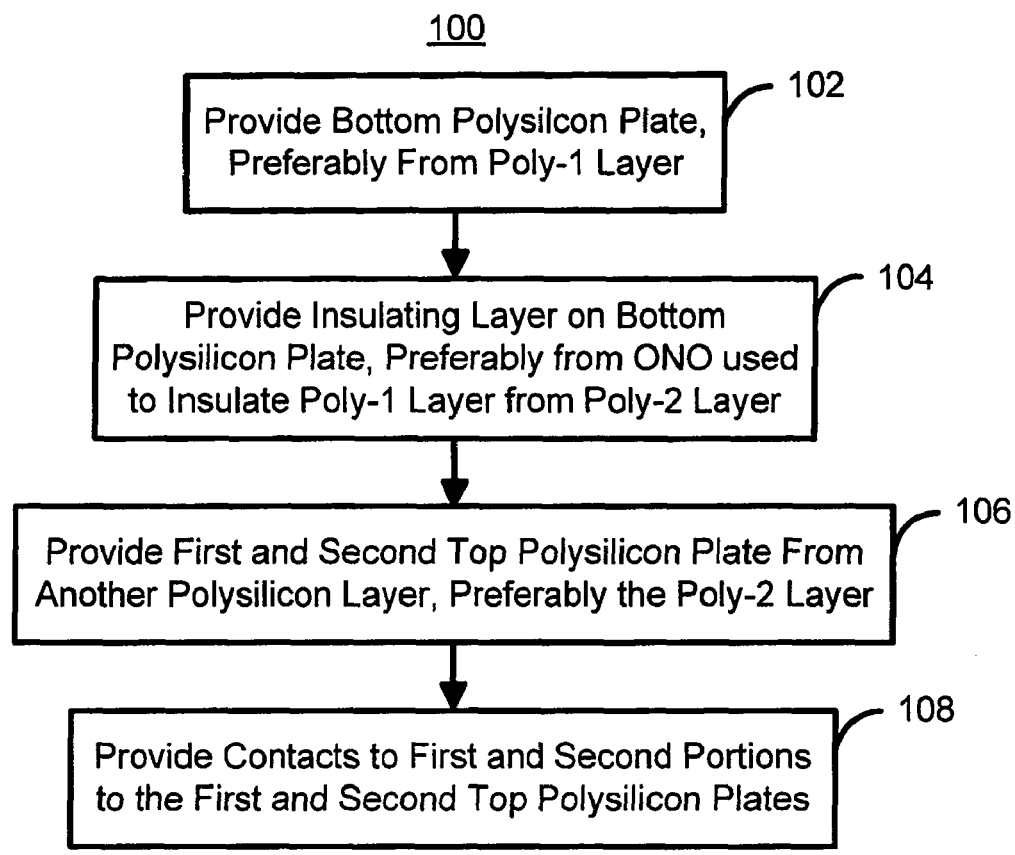
FIG. 1 is a flow chart depicting one embodiment of a method for providing a stacked capacitor in a lower voltage device such as an EEPROM.

FIG. 1 is a flow chart depicting one embodiment of a method 100 for providing a stacked capacitor in a lower voltage device such as an EEPROM. The method 100 is described in the context of a stacked capacitor formed using polysilicon layers, particularly the first and second polysilicon layers. However, one of ordinary skill in the art will readily recognize that other conducting materials and layers could be used such as but not limited to aluminum, copper, and silicide. A bottom polysilicon plate is provided, via step 102. In a preferred embodiment, the bottom polysilicon plate is part of the first polysilicon (poly-1) layer. Also in a preferred embodiment, the bottom polysilicon plate is provided on a field oxide region. An insulator is provided on the bottom polysilicon plate, via step 104. The insulator is preferably an ONO layer used in insulating the poly-1 layer from the second polysilicon (poly-2) layer of an EEPROM stack. Thus, in a preferred embodiment, the ONO layer includes a six to ten nanometer bottom oxide layer, a twelve to eighteen nanometer silicon nitride layer, and a four to seven nanometer top oxide layer. However, in another embodiment, the thicknesses of the layers of the ONO layer may differ or another insulator may be used. First and second top polysilicon plates are formed from another polysilicon layer, via step 106. In a preferred embodiment, the polysilicon layer is the poly-2 layer. Consequently, the first and second top polysilicon plates are preferably formed by transferring a pattern to the poly-2 layer. The first and second top polysilicon plates of the poly-2 layer are electrically connected through the bottom polysilicon plate and are thus preferably physically separated. The first and second top polysilicon plates thus act as top plates of capacitors connected in series through the bottom polysilicon plate. Contacts are formed on the first and second portions, via step 108. Thus, a stacked capacitor may be formed.

Figure 2:
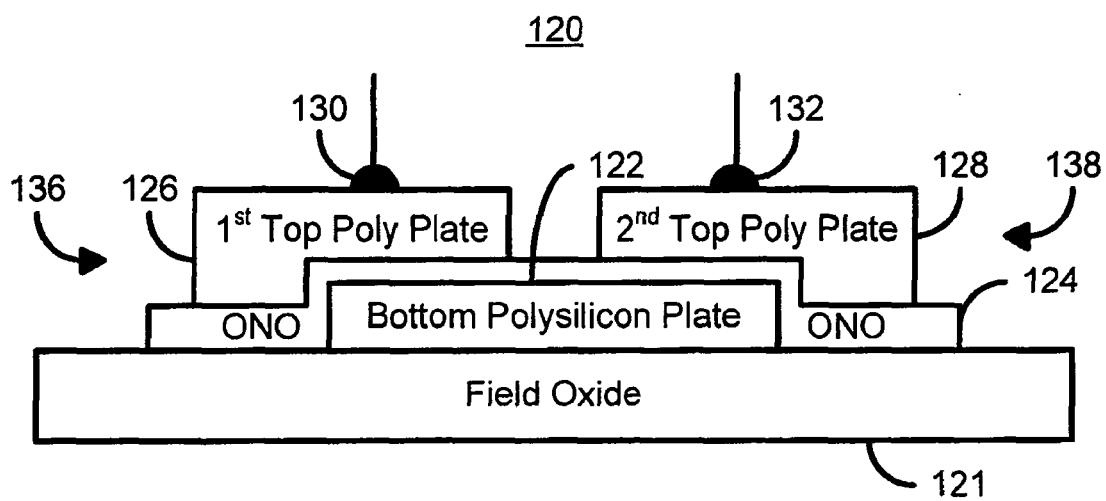
FIG. 2 is a diagram depicting a side view of one embodiment of a stacked capacitor formed in accordance with the present invention.

FIG. 2 is a diagram depicting a side view of one embodiment 120 of a stacked capacitor formed in accordance with the present invention and using the method 100. The stacked capacitor 120 is depicted as being formed on the field oxide region 121. However, in another embodiment, the stacked capacitor 120 may reside on another structure. The stacked capacitor 120 includes bottom polysilicon plate 122, an insulator 124, and top polysilicon plates 126 and 128 formed from another polysilicon layer. Contacts 130 and 132 are also shown. In the embodiment shown in FIG. 2, the insulator 124 covers and substantially surrounds the bottom polysilicon plate 122. In addition, the bottom polysilicon plate 122 is preferably part of the poly-1 layer, while the top polysilicon plates 126 and 128 are preferably part of the poly-2 layer. As can be seen in FIG. 2, the stacked capacitor 120 preferably includes two capacitors 136 and 138 connected in series. The first capacitor 136 is formed by the first top polysilicon plate 126, the insulator 124, and the bottom polysilicon plate 122. The second capacitor 138 is formed by the bottom polysilicon plate 122, the insulator 124, and the second top polysilicon plate 128. In addition, the top polysilicon plates 126 and 128, and thus the capacitors 136 and 138 are coupled in series through the bottom polysilicon plate 122.

Figure 3:
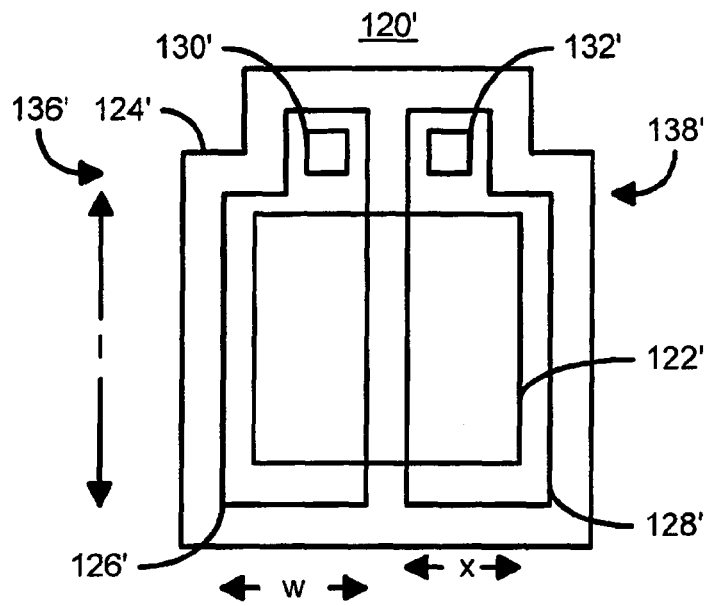
FIG. 3 is a diagram depicting a plan view of one embodiment of a stacked capacitor formed in accordance with the present invention.

FIG. 3 is a diagram depicting a plan view of one embodiment of a stacked capacitor 120' formed in accordance with the present invention. The stacked capacitor 120' is analogous to the stacked capacitor 120. Consequently, portions of the stacked capacitor 120' are labeled in a similar manner to the portions of the stacked capacitor 120. Consequently, the stacked capacitor 120' includes bottom polysilicon plate 122', an insulator 124', and top polysilicon plates 126' and 128' of the poly-2 layer. Two contacts 130' and 132' are also provided. The insulator layer 124' may, but need not, extend beyond the first and second top polysilicon plates 126' and 128' by at least 0.1 μm. The distance between the edge of the bottom polysilicon plate 122' and the contact 130' or 132' is sufficient to ensure that the bottom polysilicon plate 122' does not make electrical contact with the contact 130' or 132' and depends upon the device and technology. In one embodiment, this distance is at least 0.5 μm. The length, l, of the lower portion of the outside edge of the first and second top polysilicon plates 126' and 128' depends upon the desired capacitance of the device and, one the embodiment is 2.450 μm. The width, w, of the first and second top polysilicon plates 126' and 128', respectively, depends upon the desired capacitance of the device and, in one embodiment, is 1.050 μm. The spacing between the first and second top polysilicon plates 126' and 128' depends upon the desired capacitance of the device and, in one embodiment, is 0.7 μm. The overlap, x, between the bottom polysilicon plate 122' and the first top polysilicon plate 126' or the second top polysilicon plate 128' depends upon the desired capacitance of the device and, in one embodiment, is 0.35 μm.

Figure 4:
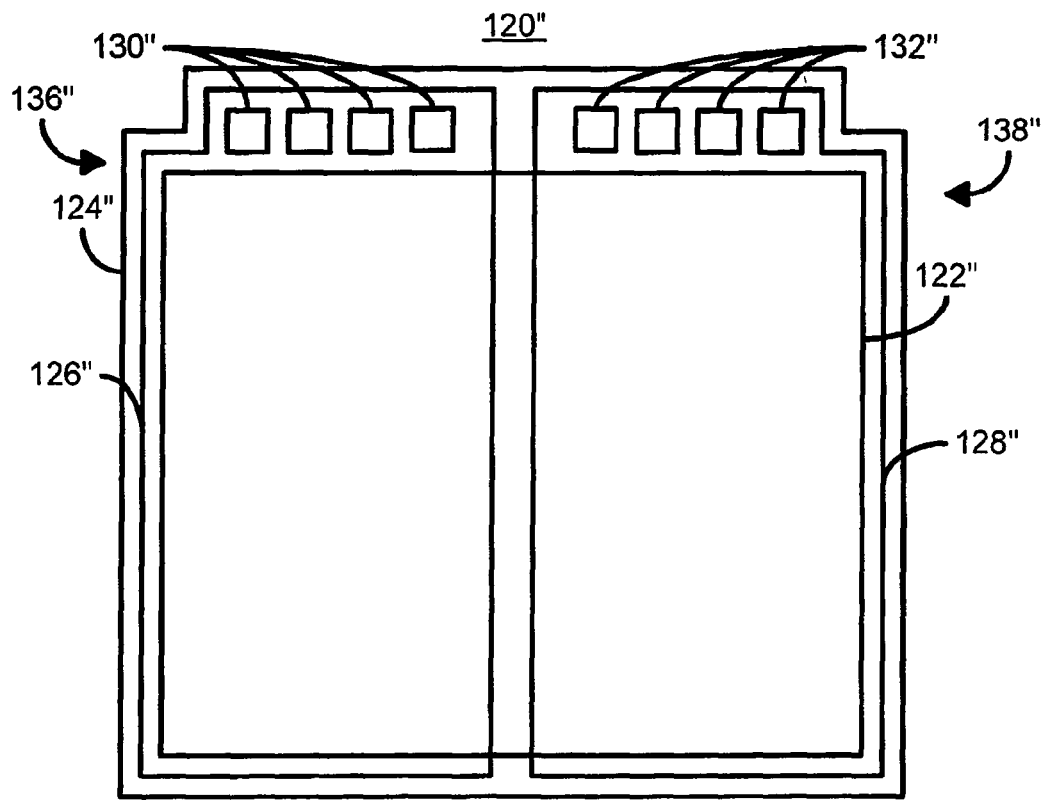
FIG. 4 is a diagram depicting a plan view of another embodiment of a stacked capacitor formed in accordance with the present invention.

FIG. 4 is a diagram depicting a plan view of another embodiment of a stacked capacitor 120" formed in accordance with the present invention. The stacked capacitor 120" is analogous to the stacked capacitors 120 and 120'. Consequently, portions of the stacked capacitor 120" are labeled in a similar manner to the portions of the stacked capacitor 120. Consequently, the stacked capacitor 120" includes a bottom polysilicon plate 122", an insulator 124", and top polysilicon plates 126" and 128". Preferably, the bottom polysilicon plate 122" and the top polysilicon plates 126" and 128" are formed from the poly-1 and poly-2 layers, respectively. In this embodiment, four contacts 130" and four contacts 132" are also provided. As can be seen in FIG. 4, the stacked capacitor 120" can be scaled. Consequently, the stacked capacitor 120" is essentially a larger version of the stacked capacitor 120'.

The stacked capacitors 120, 120', and 120" have a high breakdown voltage despite being formed using components already used in a low voltage device, such as an EEPROM. In a preferred embodiment, the stacked capacitors 120, 120', and 120" are formed from the poly-1 layer, the poly-2 layer and the ONO layer insulating the poly-1 layer from the poly-2 layer. The stacked capacitors 120, 120', and 120" each includes capacitors 136 and 138, 136' and 138', and 136" and 138", respectively, coupled in series through the bottom polysilicon plate 122, 122', and 122", respectively. The capacitors 136 and 138, 136' and 138', and 136" and 138" individually may have an insufficient breakdown voltage. However, because of the series coupling, the voltage across the insulator 124, 124', or 124", is half that of the voltage across the entire stacked capacitor 120, 120', or 120", respectively. Thus, the stacked capacitors 120, 120', and 120", therefore, preferably may support a voltage that is approximately at least twice the voltage between the plates of the capacitor 136 or 138,136' or 138', or 136" or 138". Stated differently, the voltage for the stacked capacitor 120, 120', or 120" may be approximately at least twice the voltage between the polysilicon layers. Consequently, the stacked capacitors 120, 120', 120" may have a high breakdown voltage, may be relatively easily incorporated into low voltage devices such as EEPROMs, and may be formed using elements in such devices.

Figure 5:
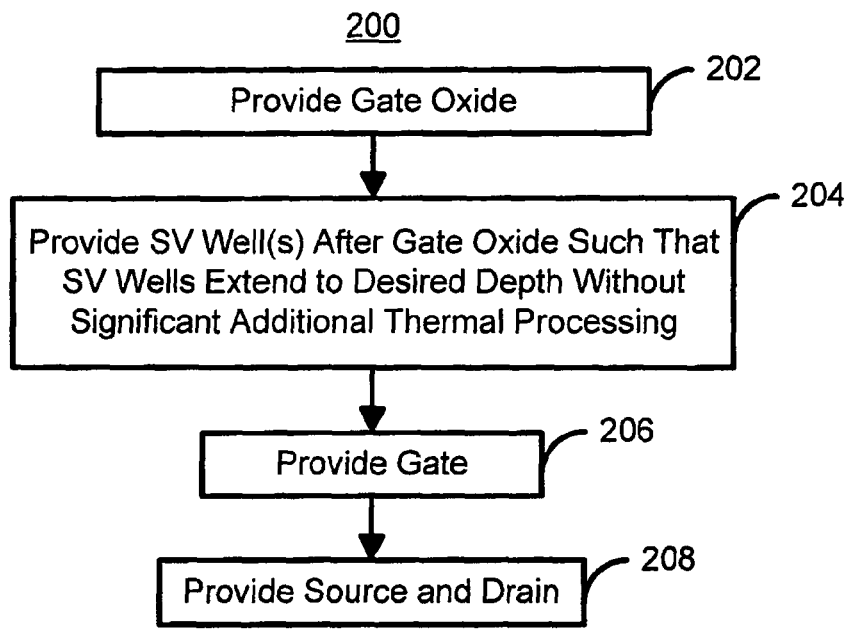
FIG. 5 is a flow chart depicting one embodiment of a method for providing a DMOS transistor in a lower voltage device such as an EEPROM.

FIG. 5 is a flow chart depicting one embodiment of a method 200 for providing a DMOS transistor in a lower voltage device such as an EEPROM. The method 200 preferably commences after an active area of the region has been defined and oxides such as tunnel, field, and certain gate oxides have been formed, after a poly-1 layer has been provided, and after wells for any charge pump devices have been formed. A gate oxide capable of sustaining a higher voltage is formed, via step 202. The gate oxide formed in step 202 is preferably a thick gate oxide having a thickness of at least twenty nanometers and, in one embodiment, approximately twenty-seven nanometers. At least one SV well is provided after formation of the gate oxide, via step 204. In one embodiment, the SV well(s) are provided before other structures for the DMOS transistor are formed. In a preferred embodiment, the SV well(s) are provided substantially immediately after (e.g. in the next processing step) formation of the gate oxide in step 202. Step 204 is performed such that the SV well(s) have the desired depth and shape without requiring significant additional thermal processing such as a drive step or anneal that may adversely affect the device of which the DMOS transistor is a part. Thus, in a preferred embodiment, step 204 is performed such that the formation of the SV well(s) having certain desired features, including the desired location and depth, can be accomplished without thermal treatments that may adversely affect an EEPROM. As used herein, therefore, significant additional thermal processing includes thermal processing which may adversely affect the device of which the transistor being formed is a part. In one embodiment, significant thermal processing includes processing using temperatures above 900° C. In another embodiment, significant thermal processing includes processing that occurs above 900° C. for approximately thirty minutes or more. Consequently, step 204 preferably includes providing three implants for each type of well, each implant having the desired type and a sufficient energy for the implanted impurities to reside at the desired location. The gate for the DMOS transistor is formed, via step 206. The source and drain for the DMOS transistor are also provided, via step 208.

Figure 6:
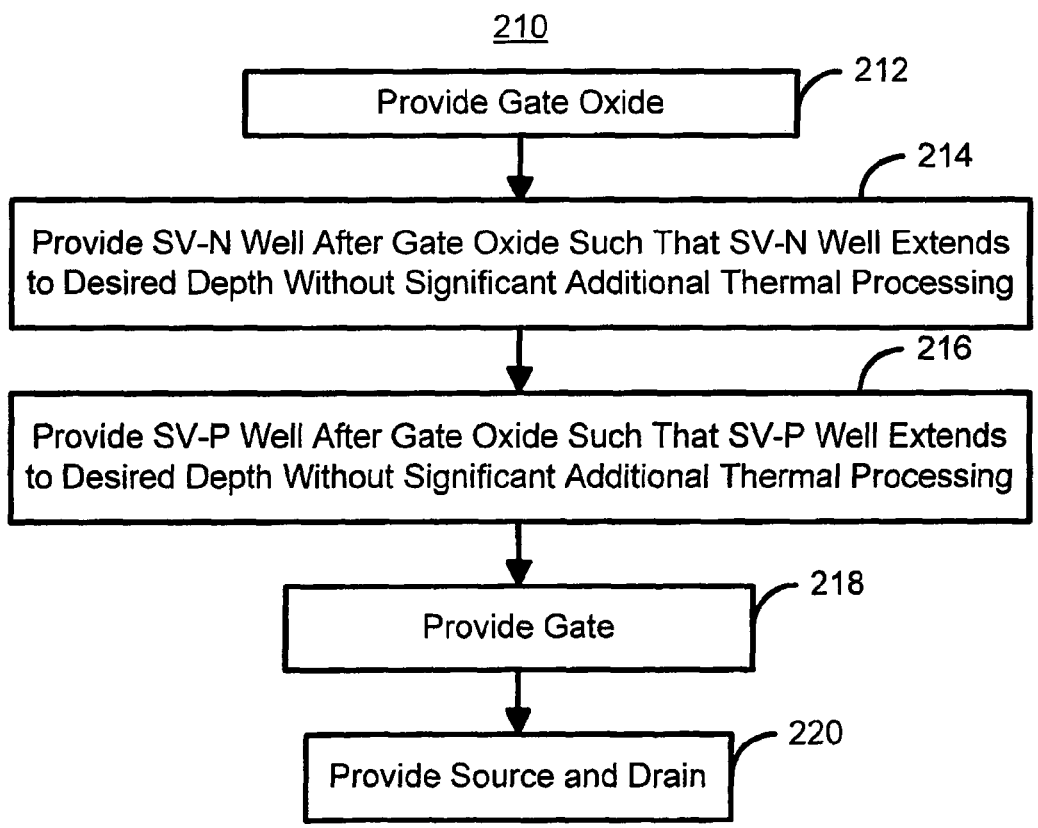
FIG. 6 is a flow chart depicting another embodiment of a method for providing a DMOS transistor in a lower voltage device such as an EEPROM.

FIG. 6 is a flow chart depicting another embodiment of a method 210 for providing a DMOS transistor in a lower voltage device such as an EEPROM. The method 210 preferably commences after an active area of the region has been defined and oxides such as tunnel, field, and certain gate oxides have been formed, after a poly-1 layer has been provided, and after wells for any charge pump devices have been formed. A gate oxide capable of sustaining a higher voltage is formed, via step 212. The gate oxide formed in step 212 is preferably a thick gate oxide having a thickness of at least twenty nanometers and, in one embodiment, approximately twenty-seven nanometers. An SV-N well is provided after formation of the gate oxide, via step 214. An SV-P well is also provided after formation of the gate oxide, via step 216. In one embodiment, the SV wells are provided in steps 214 and 216 before other structures for the DMOS transistor are formed. In a preferred embodiment, the SV wells are provided substantially immediately after (e.g. in the next processing steps) formation of the gate oxide in step 212. Steps 214 and 216 are performed such that the SV wells have the desired depth without requiring significant additional thermal processing such as a drive step or anneal that may adversely affect the device of which the DMOS transistor is a part. Thus, in a preferred embodiment, steps 214 and 216 are performed such that the formation of the SV wells having certain desired features, including the desired locations and depths, can be accomplished without significant thermal treatments that may adversely affect an EEPROM. Consequently, steps 214 and 216 preferably include providing three implants for each type of well, each implant has the desired type and at least one implant has a sufficient energy for the implanted impurities to reside at the desired location. For example, in one embodiment, the SV-N well is formed using a $P^+$ implant of $3 \times 10^{12}$ and 2 MeV, a $P^+$ implant of $2 \times 10^{12}$ and 230 keV, and either a $BF_2^+$ implant of $1.3 \times 10^{12}$ and 50 keV or $B^+$ implant of $1.3 \times 10^{12}$ and 20 keV. In one embodiment, the SV-P well is formed using a $B^+$ implant of $4 \times 10^{12}$ and 500 keV, a $B^+$ implant of $3 \times 10^{12}$ and 70 keV, and a $B^+$ implant of $3.8 \times 10^{12}$ and 20 keV or a $BF_2$ implant of $3.8 \times 10^{12}$ and 50 keV. In the embodiment described, the doses are within plus or minus one hundred percent, while the energies may be plus or minus fifty percent. The implants described above are for one embodiment. The implantation, including the species and energy, may be varied. For example, the third implant described above (such as the $B^+$ or $BF_2$ implant of the SVN well) may be replaced by a P implant of 40-70 keV or an As implant of 50-80 keV. In another embodiment, the P implants may be 150-250 keV or 1-3 MeV, the $B^+$ implant may be 15-30 keV, and the $BF_2$ implant may be 50-80 keV. The gate for the DMOS transistor is formed, via step 218. The source and drain for the DMOS transistor are also provided, via step 220.

Figure 7:
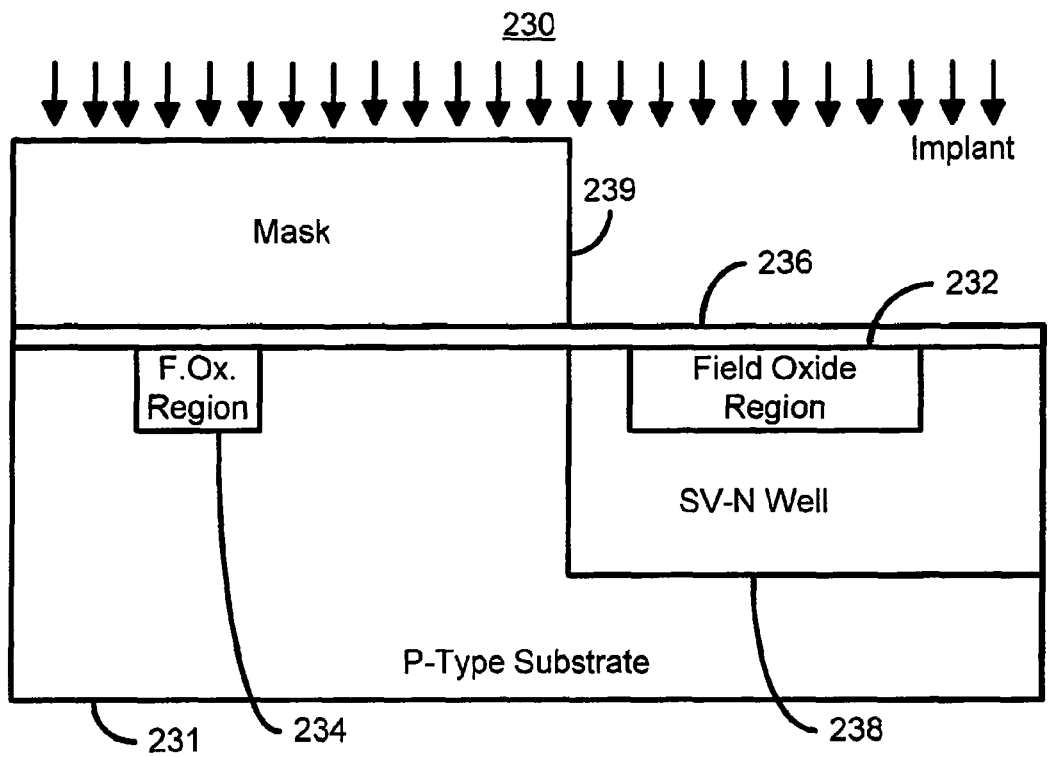
FIG. 7 is a diagram depicting a side view of one embodiment of a DMOS transistor in accordance with the present invention during SV-N well implantation during fabrication.

FIG. 7 is a diagram depicting a side view of one embodiment of a portion of a DMOS transistor 230 in accordance with the present invention during SV-N well implantation during fabrication. The DMOS transistor 230 is a NDMOS device. The DMOS transistor 230 is formed in a P-type substrate 231. The field oxide regions 232 and 234 are previously formed and a portion of the DMOS transistor 230 covered using mask 239. The DMOS transistor 230 includes a gate oxide 236 and SV-N well 238 being implanted.

Figure 8:
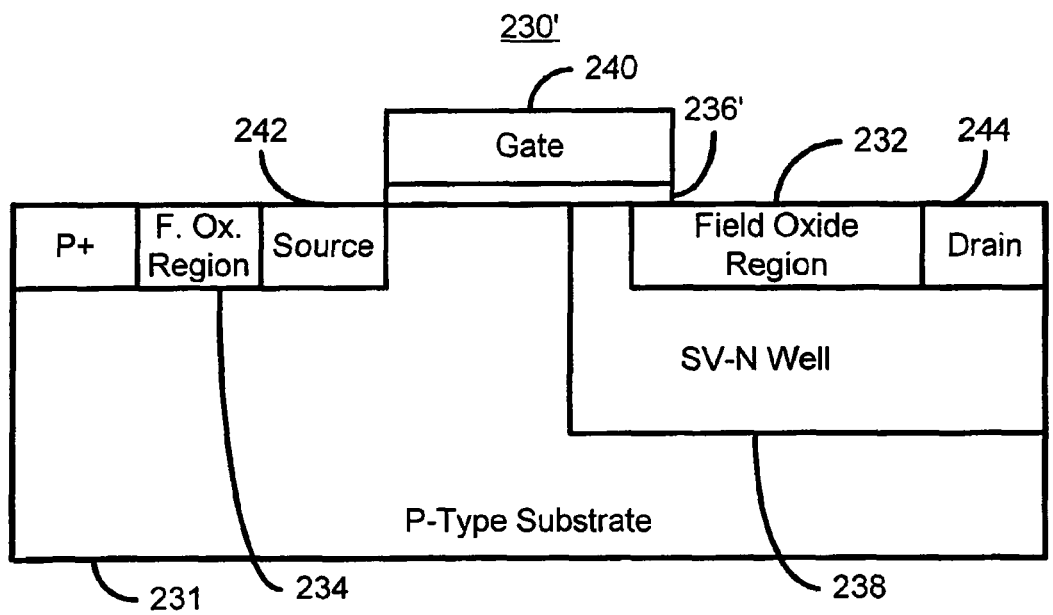
FIG. 8 is a diagram depicting a side view of one embodiment of a DMOS transistor in accordance with the present invention.

FIG. 8 is a diagram depicting a side view of one embodiment of the DMOS transistor 230' in accordance with the present invention after fabrication is completed. The DMOS transistor 230' is a NDMOS device. Thus, the DMOS transistor 230' includes SV-N well 238, a gate 240 separated from the substrate 231 and SV-N well 238 by the gate oxide 236', source 242, and drain 244.

Figure 9:
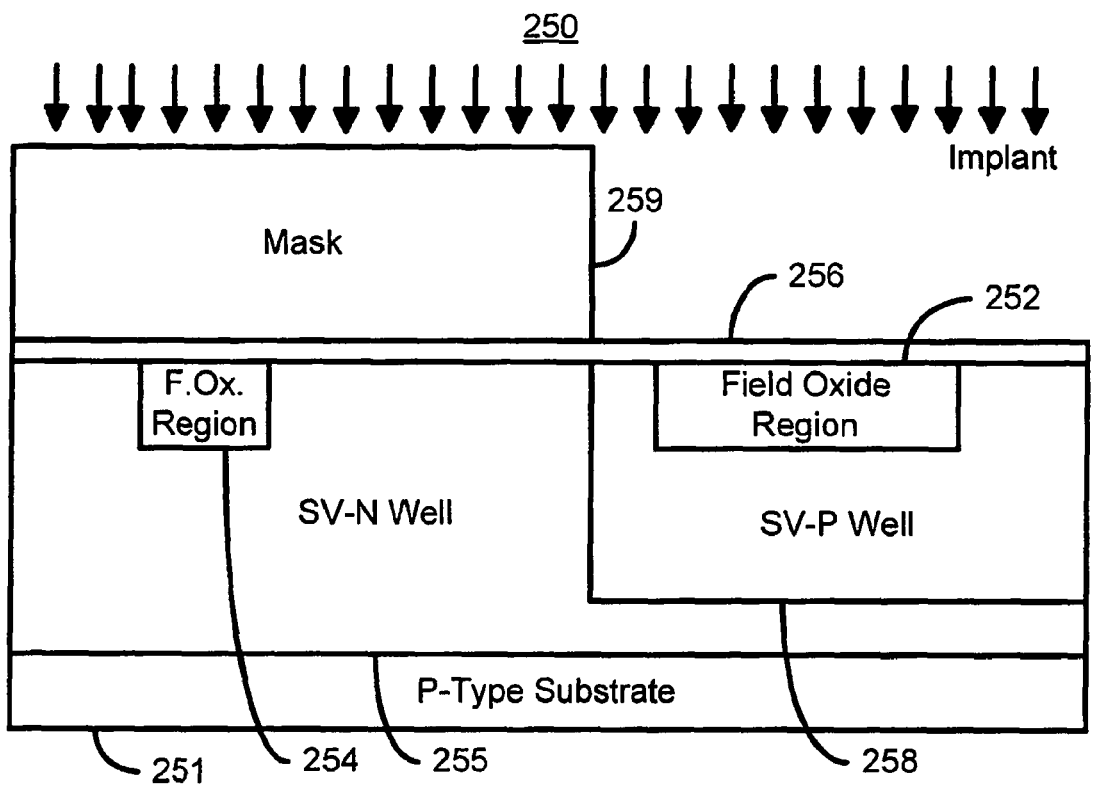
FIG. 9 is a diagram depicting a side view of one embodiment of a DMOS transistor in accordance with the present invention during SV-P well implantation during fabrication.

FIG. 9 is a diagram depicting a side view of one embodiment of a DMOS transistor 250 in accordance with the present invention during SV-P well implantation during fabrication. The DMOS transistor 250 is a PDMOS device. The DMOS transistor 250 is formed in a P-type substrate 251. The field oxide regions 252 and 254 are previously formed and a portion of the DMOS transistor 250 covered using mask 259.

The DMOS transistor 250 includes a gate oxide 256 and SV-P well 258 being implanted. In addition, another SV-N well 255 has been provided.

Figure 10:
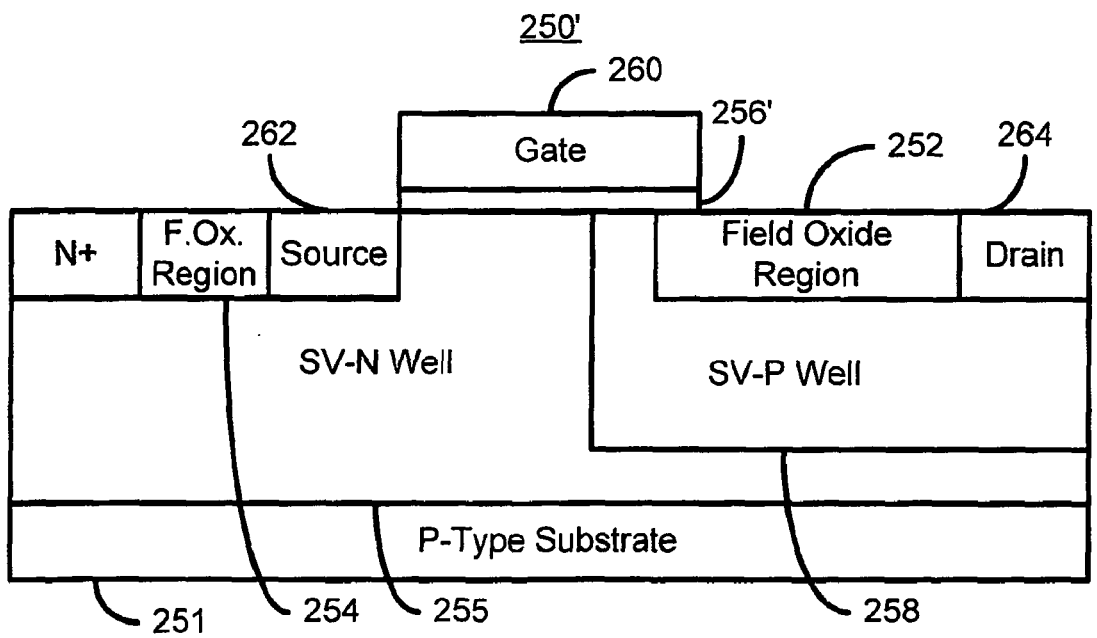
FIG. 10 is a diagram depicting a side view of one embodiment of a DMOS transistor in accordance with the present invention.

FIG. 10 is a diagram depicting a side view of one embodiment of a DMOS transistor 250 in accordance with the present invention. The DMOS transistor 250' is a PDMOS device. Thus, the DMOS transistor 250' includes SV-N well 255, SV-P well 258, a gate 260 separated from the SV-N well 255 and the SV-P well 258 by the gate oxide 256', source 262, and drain 264.

Thus, the DMOS transistors 230' and 250' are capable of supporting a high voltage. Furthermore, because the SV wells 238, 258, and preferably 255 are provided such that significant subsequent thermal treatments such as drive steps or anneals steps are not required, formation of the DMOS transistors 230' and 250' does not adversely affect formation of the low voltage device, such as an EEPROM. Consequently, the DMOS transistors 230' and 250' may be incorporated into a low voltage device.

A method and system for fabricating high voltage components in low voltage devices, such as EEPROMs have been described. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A stacked capacitor comprising:
a bottom polysilicon plate residing on a field oxide region layer, the bottom polysilicon plate being part of a first polysilicon layer and being electronically floating;
an ONO layer covering the bottom polysilicon plate;
a second polysilicon layer including a first top polysilicon plate and a second top polysilicon plate, the ONO layer residing between first top polysilicon plate and the bottom polysilicon plate and between the second top polysilicon plate and the bottom polysilicon plate, the first top polysilicon plate being physically separate from the second top polysilicon plate and electrically connected to the second top polysilicon plate through the bottom polysilicon plate such that the first top polysilicon plate and the second top polysilicon plate form top plates of capacitors connected in series through the bottom polysilicon plate;
a first contact on the first top polysilicon plate; and
a second contact on the second top polysilicon plate.

2. The stacked capacitor of claim 1, wherein the ONO layer includes:
a bottom oxide layer having a thickness of about 6 to about 10 nm,
a silicon nitride layer having a thickness of about 12 to about 18 nm, and
a top oxide layer having a thickness of about 4 to about 7 nm.

3. The stacked capacitor of claim 2, wherein the ONO layer completely covers the bottom plate.

4. The stacked capacitor of claim 3, wherein the ONO layer is an insulator in the stacked capacitor.

5. A stacked capacitor comprising:
a bottom polysilicon plate residing on a field oxide region layer;
an ONO layer covering the bottom polysilicon plate;
a first top polysilicon plate;
a second top polysilicon plate, the ONO layer residing between first top polysilicon plate and the bottom polysilicon plate and between the second top polysilicon plate and the bottom polysilicon plate, the first top polysilicon plate being physically separate from the second top polysilicon plate and electrically connected to the second top polysilicon plate through the bottom polysilicon plate such that the first top polysilicon plate and the second top polysilicon plate form top plates of capacitors connected in series through the bottom polysilicon plate;
a first contact on the first top polysilicon plate; and
a second contact on the second top polysilicon plate.

6. The stacked capacitor of claim 5, wherein the ONO layer includes:
a bottom oxide layer having a thickness of about 6 to about 10 nm,
a silicon nitride layer having a thickness of about 12 to about 18 nm, and
a top oxide layer having a thickness of about 4 to about 7 nm.

7. The stacked capacitor of claim 5, wherein the bottom polysilicon plate is part of a first polysilicon layer.

8. The stacked capacitor of claim 7, wherein the first polysilicon layer is electrically floating.

9. The stacked capacitor of claim 7, wherein the first top polysilicon plate and the second top polysilicon plate are part of a second polysilicon layer.

10. The stacked capacitor of claim 5, wherein the ONO layer completely covers the bottom polysilicon plate.

11. The stacked capacitor of claim 10, wherein the ONO layer is an insulator in the stacked capacitor.

12. A stacked capacitor comprising:
a bottom plate;
an insulator covering at least a portion of the bottom plate; and
a layer including a first top plate and a second top plate that is physically separated from the first top plate, the insulator residing between the first top plate and the bottom plate, and between the second top plate and the bottom plate, the first top plate being electrically connected to the second top plate through the bottom plate such that the first top plate and the second top plate form top plates of capacitors connected in series through the bottom plate.

13. The stacked capacitor of claim 12, wherein the bottom plate is electrically floating.

14. The stacked capacitor of claim 12, wherein a first contact is coupled with the first top plate and a second contact is coupled with the second top plate.

15. The stacked capacitor of claim 12, wherein the bottom plate is a bottom polysilicon plate, the first top plate is a first top polysilicon plate, and the second top plate is a second top polysilicon plate.

16. The stacked capacitor of claim 15, wherein the insulator is ONO.

17. The stacked capacitor of claim 16, wherein the ONO includes:
a bottom oxide layer having a thickness of about 6 to about 10 nm,
a silicon nitride layer having a thickness of about 12 to about 18 nm, and
a top oxide layer having a thickness of about 4 to about 7 nm.

18. The stacked capacitor of claim 15, wherein the bottom polysilicon plate is part of a first polysilicon layer.

19. The stacked capacitor of claim 18, wherein the first top polysilicon plate and the second top polysilicon plate are part of a second polysilicon layer.

20. The stacked capacitor of claim 12, wherein the insulator completely covers the bottom plate.

21. A stacked capacitor comprising:
   a bottom polysilicon plate residing on a field oxide region layer, the bottom polysilicon plate being part of a first polysilicon layer and being electronically floating;
   an ONO layer covering the bottom polysilicon plate, the ONO layer including a bottom oxide layer having a thickness of about 6 to about 10 nm, a silicon nitride layer having a thickness of about 12 to about 18 nm, and a top oxide layer having a thickness of about 4 to about 7 nm;
   a second polysilicon layer including a first top polysilicon plate and a second top polysilicon plate that is physically separated from the first top polysilicon plate, the ONO layer residing between first top polysilicon plate and the bottom polysilicon plate and between the second top polysilicon plate and the bottom polysilicon plate, the first top polysilicon plate being electrically connected to the second top polysilicon plate through the bottom polysilicon plate;
   a first contact on the first top polysilicon plate; and
   a second contact on the second top polysilicon plate.

* * * * *

UNITED STATES PATENT AND TRADEMARK OFFICE
CERTIFICATE OF CORRECTION

PATENT NO.        : 8,093,640 B2
APPLICATION NO.   : 12/501820
DATED             : January 10, 2012
INVENTOR(S)       : Schwantes et al.

It is certified that error appears in the above-identified patent and that said Letters Patent is hereby corrected as shown below:

On the title page, column 2, "Other Publications", line 1, please delete "Offfice" and insert therefor --Office--;

On the title page, column 2, "Other Publications", page 2, line 2, please delete "Requirment" and insert therefor --Requirement--;

On the title page, column 2, "Other Publications", page 2, line 5, please delete "Requirment" and insert therefor --Requirement--;

In the drawings, Sheet 1 of 5, FIG. 1, Reference Numeral 102, please delete "Polysilcon" and insert therefor --Polysilicon--.

Signed and Sealed this
Twenty-seventh Day of March, 2012

David J. Kappos
*Director of the United States Patent and Trademark Office*